US008798078B2

(12) United States Patent
Moore et al.

(10) Patent No.: US 8,798,078 B2
(45) Date of Patent: Aug. 5, 2014

(54) PLURALITY OF SENSORS COUPLED TO A SERIES OF SWITCHING DEVICES

(75) Inventors: David A. Moore, Houston, TX (US);
Lynn G. Pipkin, III, Houston, TX (US);
Allen T. Morrison, Houston, TX (US);
Hoang Thanh Nguyen, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 343 days.

(21) Appl. No.: 13/147,792

(22) PCT Filed: Mar. 13, 2009

(86) PCT No.: PCT/US2009/037164
§ 371 (c)(1),
(2), (4) Date: Aug. 3, 2011

(87) PCT Pub. No.: WO2010/104519
PCT Pub. Date: Sep. 16, 2010

(65) Prior Publication Data
US 2012/0039319 A1    Feb. 16, 2012

(51) Int. Cl.
*H04L 12/28*    (2006.01)

(52) U.S. Cl.
USPC .............................. 370/400; 709/220; 340/3.1

(58) Field of Classification Search
None
See application file for complete search history.

(56) References Cited

U.S. PATENT DOCUMENTS

| 6,959,399 | B2 | 10/2005 | King et al. |
| 7,031,870 | B2* | 4/2006 | Sharma et al. ............... 702/130 |
| 7,148,796 | B2* | 12/2006 | Joy et al. ...................... 340/521 |
| 7,644,051 | B1* | 1/2010 | Moore et al. ................... 706/21 |
| 7,685,323 | B1* | 3/2010 | Moore et al. ..................... 710/8 |
| 2002/0124128 | A1 | 9/2002 | Qiu |
| 2005/0286220 | A1* | 12/2005 | Moore et al. ................. 361/687 |
| 2009/0164811 | A1* | 6/2009 | Sharma et al. ............... 713/310 |

FOREIGN PATENT DOCUMENTS

| CN | 1815924 A | 8/2006 |
| CN | 1947354 A | 4/2007 |
| WO | WO-00/13110 | 3/2000 |

OTHER PUBLICATIONS

1wire@simat.Org.Uk: "iButton 1-Wire Hub", Feb. 17, 2009, XP055078783, retrieved from the Internet: URL:http://web.archive.org/web/20090217130425/http://www.simat.org.uk/1wirehub.html.
1wire@simat.Org.Uk "Typical 1-Wire Networks using the SIMAT 1-Wire Hub", Oct. 9, 2006, XP056078781, Retrieved from the Interact URL: http://web.archive.org/web/2006100905153/http://www.simat.org.uk/images/1wirehub-topology.pdf.
Dallas Semiconductor: "Application Note 106 Complex MicroLANs", May 12, 1997, XP055079095, Retrieved from the Internet: URL: http//www.elin.ru/files/pdf/1-Wire/app106.pdf, p. 1, col. 1, line 27-line 31; figure 1 p. 3. col. 1, line 1-p. 4, col. 1, line 15; figure 2.

(Continued)

*Primary Examiner* — Brian Roberts

(57) ABSTRACT

A plurality of sensors are coupled to switching devices arranged in a series of switching devices. Each switching device has an upstream port and a downstream port. The series of switching devices is formed by coupling the downstream port of each switching device, except a last switching device in the series of switching devices, to the upstream port of a next switching device in the series of switching devices.

14 Claims, 9 Drawing Sheets

(56) References Cited

OTHER PUBLICATIONS

Dallas Semiconductor: "DS2407 Dual Addressable Switch Plus 1-kbit Memory", Jan. 25, 2001, XP055079196, Retrieved from the Internet: URL:http://datasheets.maximintegrated.com/en/ds/DS2407.pdf.

Dallas Semiconductor: "DS2409 MicroLAN Coupler", Nov. 19, 2001, XP055078501, Retrieved from the Internet: URL:http://neutrino.phys.ksu.edu/~-gahs/doublechooz/DC_SlowMRS/DS/DS2409.pdf.

Dan Awtrey, "A Layman's Overview of 1-Wire Technology and Its Use", Aug. 13, 2002, XP055078262, Retrieved from the Internet: URL: http://web.archive.org/web/20070908075711/http://www.1wire.org/Files/Awtrey/Articles/Intro%20to%201-Wire.doc.

European Patent Office, European Search Report, 4 pages, Sep. 17, 2013.

Maxim Integrated; "DS2413 1-Wire Dual Channel Addressable Switch", Feb. 4, 2005, XP055078272, Retrieved from the Internet: URL:http://datasheets.maximintegrated.com/en/ds/DS2413.pdf Springbok Digitronics: "1-Wire Design Guide v1.0", Aug. 19, 2004, XP055077760, Retrieved from the Internet: URL:http://www.1wire.org/Files/Articles/1-Wire-Design%20Guide%20v1.0.pdf.

\* cited by examiner

PLURALITY OF SENSORS COUPLED TO A SERIES OF SWITCHING DEVICES

BACKGROUND

A data center may be defined as a location that houses computer and other electronic equipment in a high density configuration. Typically, much of the equipment is deployed in equipment racks. Densities of 128 discrete server computers per rack are achievable with current technology, and it is expected that densities will continue to increase. The servers in a rack can use considerable amounts of electricity, and accordingly, dissipate significant amounts of heat. A typical rack of servers may use 10 kW, and a large data center may have 1000 racks of servers.

To remove the heat generated in a large data center, the data center will be configured with many computer room air conditioning (CRAC) units, which operate to deliver cool air to the data center to keep servers and other devices from overheating. The energy consumed by the CRAC units comprises a significant share of the total energy consumed by the data center.

BRIEF DESCRIPTION OF THE DRAWINGS

The Figures depict embodiments, implementations, and configurations of the invention, and not the invention itself.

DETAILED DESCRIPTION

Figure 1:
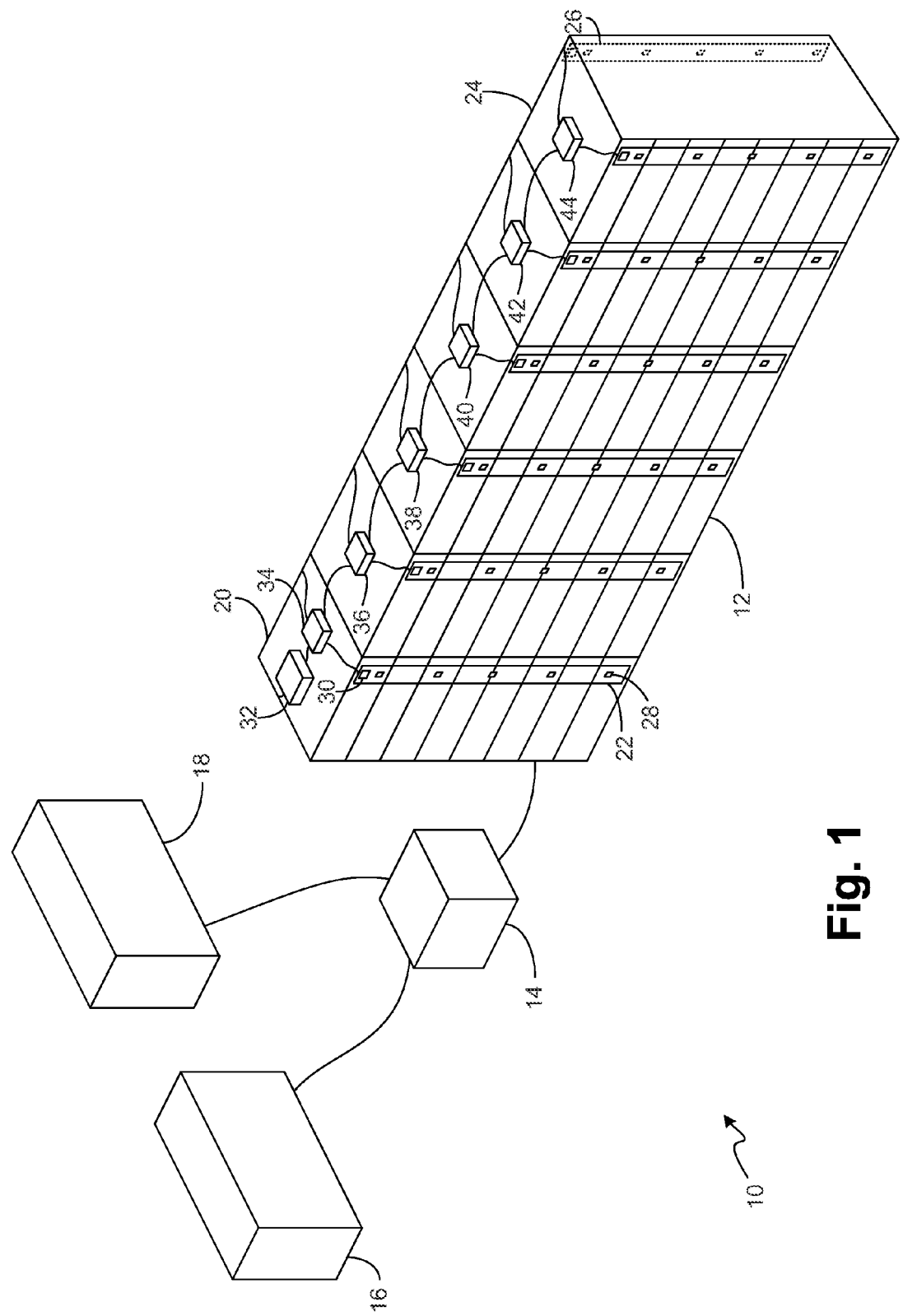
FIG. 1 is a perspective view of a portion of a data center in which embodiments of the present invention have been deployed.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

Embodiments of the present invention relate to sensors coupled to a series of switching devices, and discovering the series of switching devices. Before considering the present invention in detail, first consider the environment in which embodiments of the present invention will be deployed.

Dynamic Smart Cooling (DSC) is a term used by Hewlett-Packard Company to identify a group of technologies that help customers accurately measure the effectiveness of data center cooling, and reduce costs associated with data center cooling. Consider a large data center having hundreds of racks, with each rack having more than 100 servers. Such a data center will have many computer room air conditioning (CRAC) units, with each CRAC unit having an effect on the temperature proximate to each server.

When such a data center is configured to use DSC, several temperature sensors are positioned on each rack, and readings from all sensors are transmitted to a data center environment controller (DCEC). The DCEC includes a commissioning module. By incrementally increasing and decreasing the cooling output of each CRAC unit, and measuring the result at each temperature sensor, the commissioning module is able to create a profile that represents the effect of each CRAC unit at each sensor. With this information, the DCEC is able to control the CRAC units to ensure that all servers receive sufficient cooling, while minimizing wasteful overcooling in other areas of the data center.

In a typical prior art deployment, a base station is coupled to each rack. The base station is a device having a microcontroller, an electrically erasable programmable read-only memory (EEPROM) for storing program instructions and data, RAM, an Ethernet interface, and a 1-Wire network interface. The Ethernet controller of each base station is coupled to the DCEC using Ethernet coupling devices known in the art, such as switches and routers.

1-Wire is a registered trademark of Maxim Integrated Products, Inc., and 1-Wire devices communicate over a bus that comprises a single wire that carries data between all devices on the bus. Typically, a ground wire is also coupled to each device. In one configuration, the single wire is also used to power 1-Wire devices, with the devices storing charge in a capacitor when the single wire is high, and using the charge stored in the capacitor to power the device with the single wire is low. In another configuration, one or more additional power lines are provided to 1-Wire devices.

The 1-Wire interface of each base station is coupled to one or more plug in assemblies (PIAs). In one configuration, a PIA is a strip that is mounted vertically along the length of an air-intake side of the each rack, which is typically the front of the rack. Optionally, a second PIA is mounted along the back of the rack to measure the temperature of air leaving the rack. Each PIA has a series of 1-Wire temperature sensors positioned along the length of the PIA. Each PIA also includes a 1-Wire device that provides access to PIA configuration data stored in an EEPROM.

In the DSC configuration described above, the base stations multicast ID packets to a first UDP port monitored by the DCEC. When the packets have been received and processed by the DCEC, the DCEC responds by broadcasting acknowledgement packets to the base stations using a second UDP port. Once the base stations have received the acknowledgement packets, the base stations begin sending temperature data by broadcasting packets using the first UDP port.

Using this process, the DCEC is able to discover each rack in the data center. However, associating each rack with a physical location in the data center tends to be a manual process that requires a data center technician to associate a unique identifier sent by each base station with a physical location.

FIG. 1 is a perspective view of a portion of a data center 10 in which embodiments of the present invention have been deployed. Data center 10 includes a row of racks 12, a DCEC 14, and CRAC units 16 and 18.

Each rack has two PIAs, with one PIA attached to the front of the rack and measuring the temperature of air entering the rack, and a second PIA attached to the back of the rack measuring the temperature of air leaving the rack. For example, rack 20 includes PIA 22 positioned along the front of rack 20, and rack 24 includes PIA 26 (shown in phantom) positioned along the back of rack 24.

Each PIA includes five 1-Wire temperature sensors, such as temperature sensor 28 of PIA 22. Of course, those skilled in the art will recognize that additional or fewer sensors may be provided on each PIA. Also, those skilled in the art will recognize that at PIA may include other types of sensors, such as humidity and pressure sensors. Furthermore, a PIA may have a different configuration and function. For example, a PIA may be configured to sense whether a rack door is open or closed, or measure the rotational speed of a fan.

Each PIA also includes a 1-Wire device that can access configuration information stored in an EEPROM, such as device 30 of PIA 22. As used herein, the term PIA can refer to any sensor assembly that includes memory that characterizes the assembly, and the sensors deployed in the assembly.

As discussed above, previous DSC configurations deployed one base station per rack. In accordance with an embodiment of the invention shown in FIG. 1, a single base station is provided for a series of racks, and each rack is provided with a switching device. Accordingly, in FIG. 1, base station 32 is coupled to DCEC 14, and a series of switching devices. Switching device 34 of rack 20 is the first switching device of the series, and is coupled to base station 32. In turn, switching device 34 is also coupled to switching device 36, switching device 36 is coupled to switching device 38, switching device 38 is coupled to switching device 40, switching device 40 is coupled to switching device 42, and switching device 42 is coupled to switching device 44, which is the last switch in the series. Collectively, base station 32, switching devices 34, 36, 38, 40, 42, and 44, and the PIAs, such as PIA 22 and PIA 26, form a sensor network for row of racks 12.

The embodiment of the present invention shown in FIG. 1 provides several advantages over previous DSC configurations that deploy one base station per rack. First, there are significant cost savings. As will be discussed in greater detail below, a switching device in accordance with embodiments of the present invention is a much simpler device than a base station. It is anticipated that the cost of a switching device will be approximately $8, while the cost of a base station is approximately $80. Consider a data center having 1000 racks arranged in 100 rows of ten racks per row. The cost of deploying a base station at each rack would be $80,000. Using an embodiment of the present invention, a base station would be deployed for each of the 100 rows, and a switching device would be deployed for each rack. Therefore, the cost of deployment would be $16,000, thereby saving $64,000. Furthermore, additional savings are realized in the reduction of Ethernet cabling and switches.

Another advantage is that the switching devices are relatively simple devices that will typically not require firmware updates. In contrast, base stations may require firmware updates to implement improved discovery and reporting algorithms. Embodiments of the present invention significantly reduce the number of devices that may need to be updated.

Finally, embodiments of the present invention significantly reduce the effort required by a data center technician when associating PIAs with physical rack location. In the previous DSC configuration discussed above, a technician had to associate each rack with a physical location. By using embodiments of the present invention, the technician need only associate the first rack in a row with a physical location, and the physical location of the reminder of the racks can be inferred from order of the switching devices in the series, as will be discussed in greater detail below. In the data center discussed above, 1000 racks are arranged in 100 rows of ten racks per row. Accordingly, the effort required to associate each rack with a physical location is reduced by a factor of ten.

Figure 2:
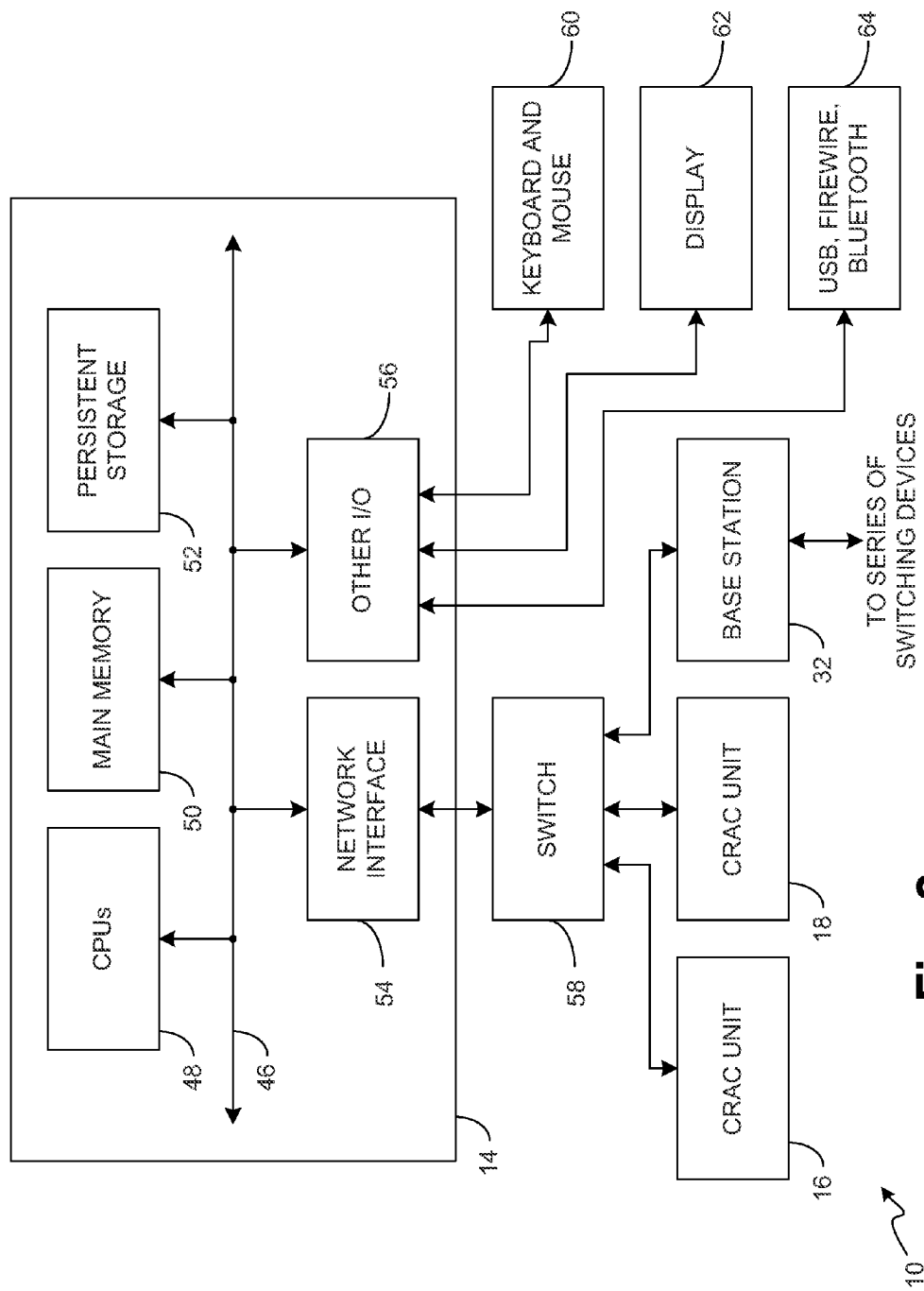
FIG. 2 shows a block diagram of a portion of the data center shown in FIG. 1, in accordance with an embodiment of the present invention.

FIG. 2 shows a block diagram of a portion of data center 10 of FIG. 1. DCEC 14 includes a bus 46. Although bus 46 is shown as a single bus for simplicity, those skilled in the art will recognize that a plurality of connected buses will typically be used.

Coupled to bus 46 are one or more CPUs 48, main memory 50, persistent storage 52, network interface 54, and other I/O 56. CPUs 48 process program instructions, and main memory 50 stores program instructions and data. Persistent storage 52 represents various forms of persistent storage known in the art, such as hard disk drives, EEPROMs, optical drives, and the like.

Network interface 54 is coupled to switch 58, which in turn is coupled to CRAC units 16 and 18, and base station 32. Note that the network interface shown connecting CRAC units 16 and 18 is merely representative. In other embodiments, a different connection technology can be used, such as the Modbus serial communications protocol, which can be implements over an RS-485 communication channel.

Other I/O 56 represents other types of I/O, and is coupled to keyboard and mouse 60, display 62, and USB, Firewire, and Bluetooth ports 64. The I/O devices shown in blocks 56 and 64 are merely representative, and those skilled in the art will recognize that DCEC 14 may have additional classes of I/O devices.

Figure 3:
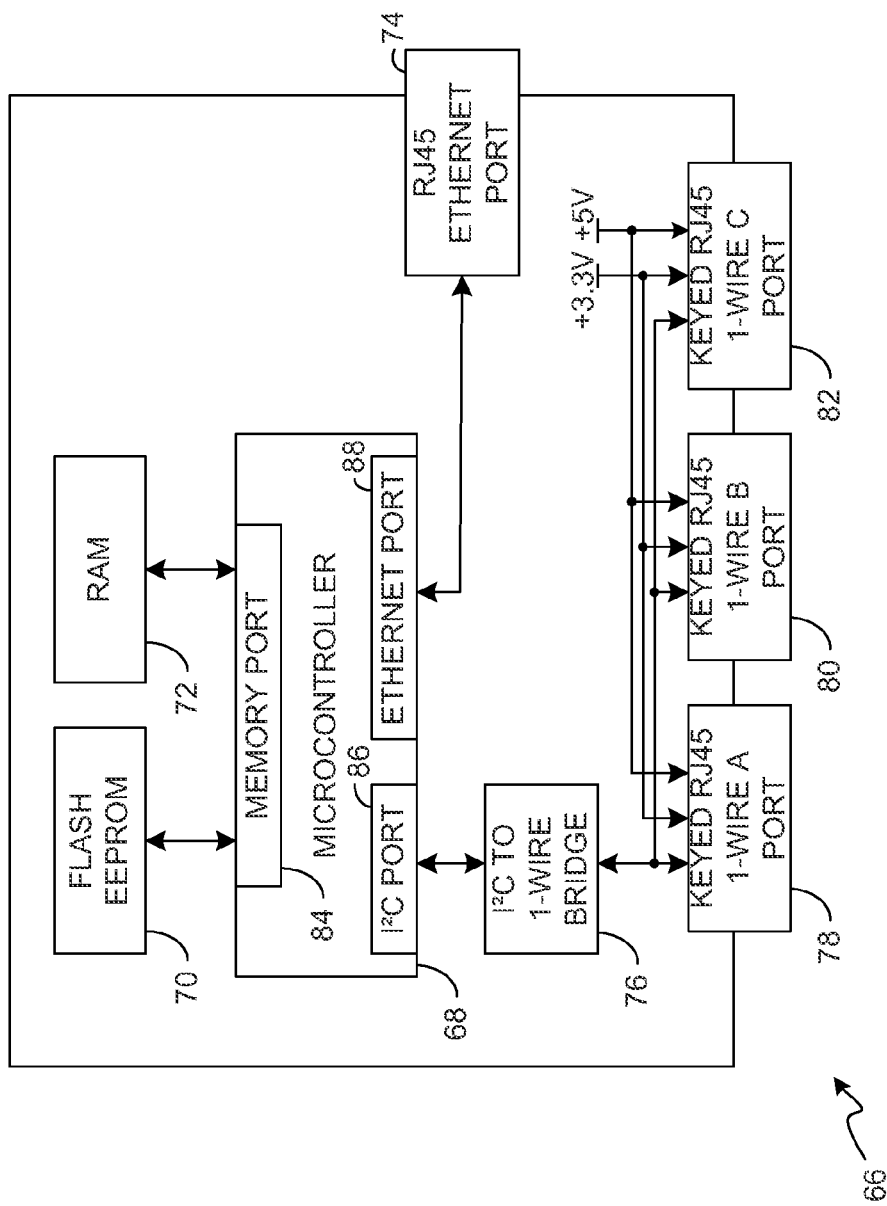
FIG. 3 is a block diagram of a base station, in accordance with an embodiment of the present invention.

In the discussion of the previous DSC configuration discussed above, a base station has an Ethernet port coupled to the DCEC, and two 1-Wire ports, with each 1-Wire coupled to a PIA. A customer can redeploy such a base station for use with an embodiment of the present invention by updating the firmware of the base station. In the embodiment shown in FIG. 1, only one 1-Wire port is used to connect to the first switching device in the series of switching devices. In another embodiment of the present invention, the PIAs of the first rack in the row of racks are coupled to the base station, and the remainder of the racks in the row are coupled to switching devices. Accordingly, a base station used in this embodiment has three 1-Wire ports, as shown in FIG. 3. Note that 1-Wire devices can be added to a 1-Wire bus by simply joining 1-Wire bus conductors, so 1-Wire ports can also be provided by a simple external "Y" connector.

FIG. 3 is a block diagram of base station 66, in accordance with an embodiment of the present invention. Base station 66 includes microcontroller 68, flash EEPROM 70, RAM 72, RJ45 Ethernet port 74, $I^2C$ to 1-Wire bridge 76, keyed RJ45 1-Wire A port 78, keyed RJ45 1-Wire B port 80, and keyed RJ45 1-Wire C port 82.

Microcontroller 68 is an integrated controller having a memory port 84, an $I^2C$ port 86, and an Ethernet port 88. A suitable microcontroller is the NS9360 ARMS processor available from Digi International. Memory port 84 is coupled to flash EEPROM 70, which stores base station firmware and persistent data. Memory port 84 is also coupled to RAM 72, which is used by base station 66 to store program instructions and data while operating. Ethernet port 88 is coupled to RJ45 Ethernet port 74, and is used to couple base station 66 to the DCEC.

I²C port 86 is coupled to I²C to 1-Wire bridge 76. A suitable bridge is the DS2482-100 I²C to 1-Wire bridge available from Maxim Integrated Products, Inc. Bridge 76 converts the I²C signals from microcontroller 68 to 1-Wire signals, which in turn are coupled to keyed RJ45 1-Wire A port 78, keyed RJ45 1-Wire B port 80, and keyed RJ45 1-Wire C port 82. As discussed above, 1-Wire devices may be powered by the 1-Wire data bus, or separate power signals may be provided. In the embodiments disclosed herein, +3.3V and +5V supply lines are provided to 1-Wire devices. Accordingly, +3.3V and +5V supply lines are coupled to ports 78, 80, and 82 in FIG. 3. For simplicity, the supply lines will not be shown in the remainder of the Figures. Also, note that ports 78, 80, and 82 use a keyed RJ45 port. Using keyed ports and connectors prevents connectors carrying 1-Wire signals from being inserted into Ethernet ports, and vice versa.

Figure 4:
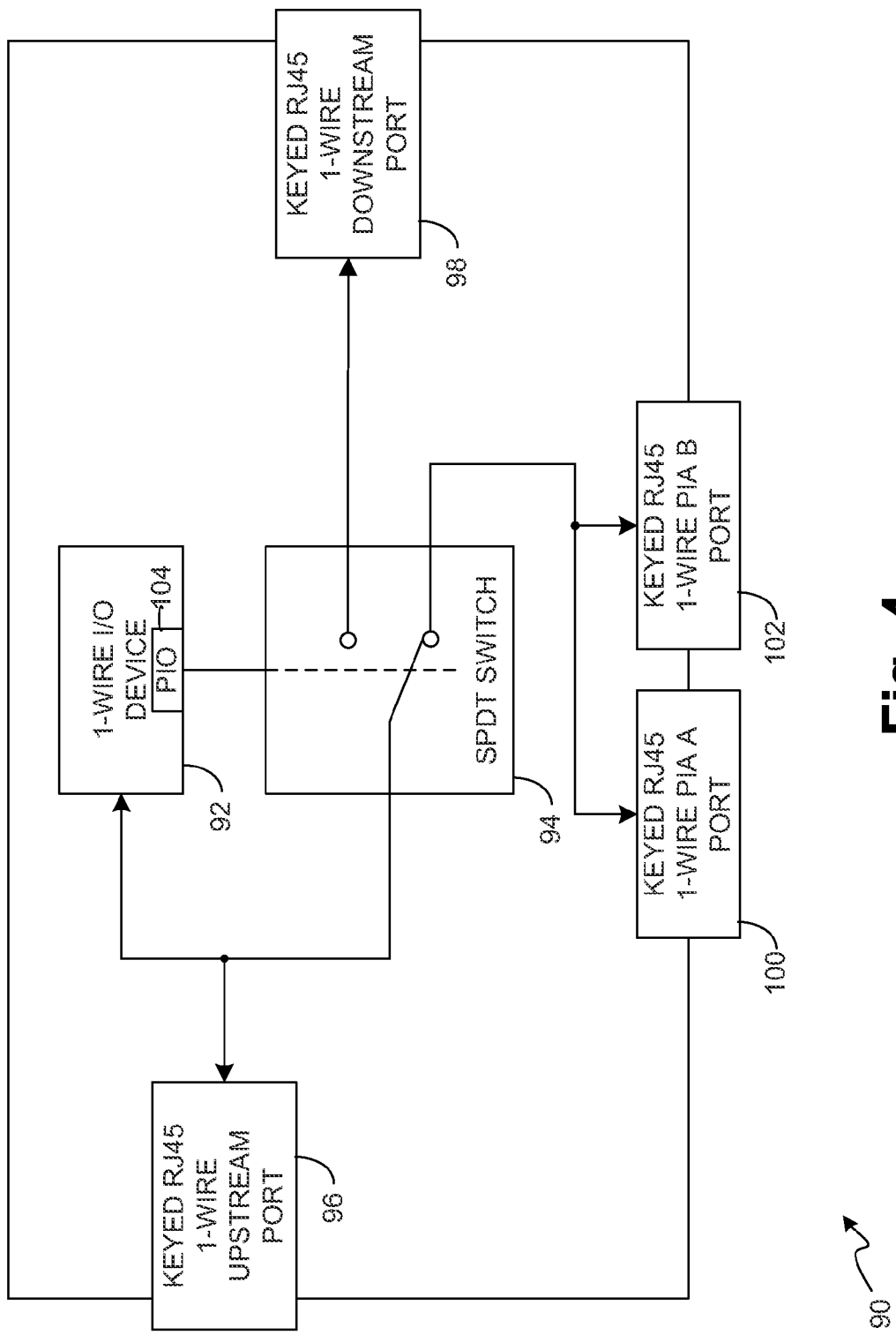
FIG. 4 shows a switching device, in accordance with an embodiment of the present invention.

FIG. 4 shows a switching device 90, in accordance with an embodiment of the present invention. Switching device 90 includes 1-Wire I/O device 92 (such as the DS2413 dual-channel programmable I/O 1-Wire chip available from Maxim Integrated Products, Inc.), single pole double throw (SPDT) switch 94, keyed RJ45 1-Wire upstream port 96, keyed RJ45 1-Wire downstream port 98, keyed RJ45 1-Wire PIA port A 100, and keyed RJ45 1-Wire PIA port B 102.

Upstream port 96 is coupled to a switching device that is upstream in the series of switching devices, or a base station if switching device 90 is the first switch in the series. The 1-Wire bus from upstream port 96 is provided to 1-Wire I/O device 92 and SPDT switch 94. 1-Wire I/O device 92 includes PIO output signal 104, which is used to control SPDT switch 94. Switch 94 may be implemented as an electro-mechanical relay, or a transistor-based switch. Under control of device 92, which acts as a switch controller, switch 94 is operable to couple the 1-Wire bus from port 96 to either keyed RJ45 1-Wire downstream port 98, or keyed RJ45 1-Wire PIA port A 100 and keyed RJ45 1-Wire PIA port B 102.

Figure 5:
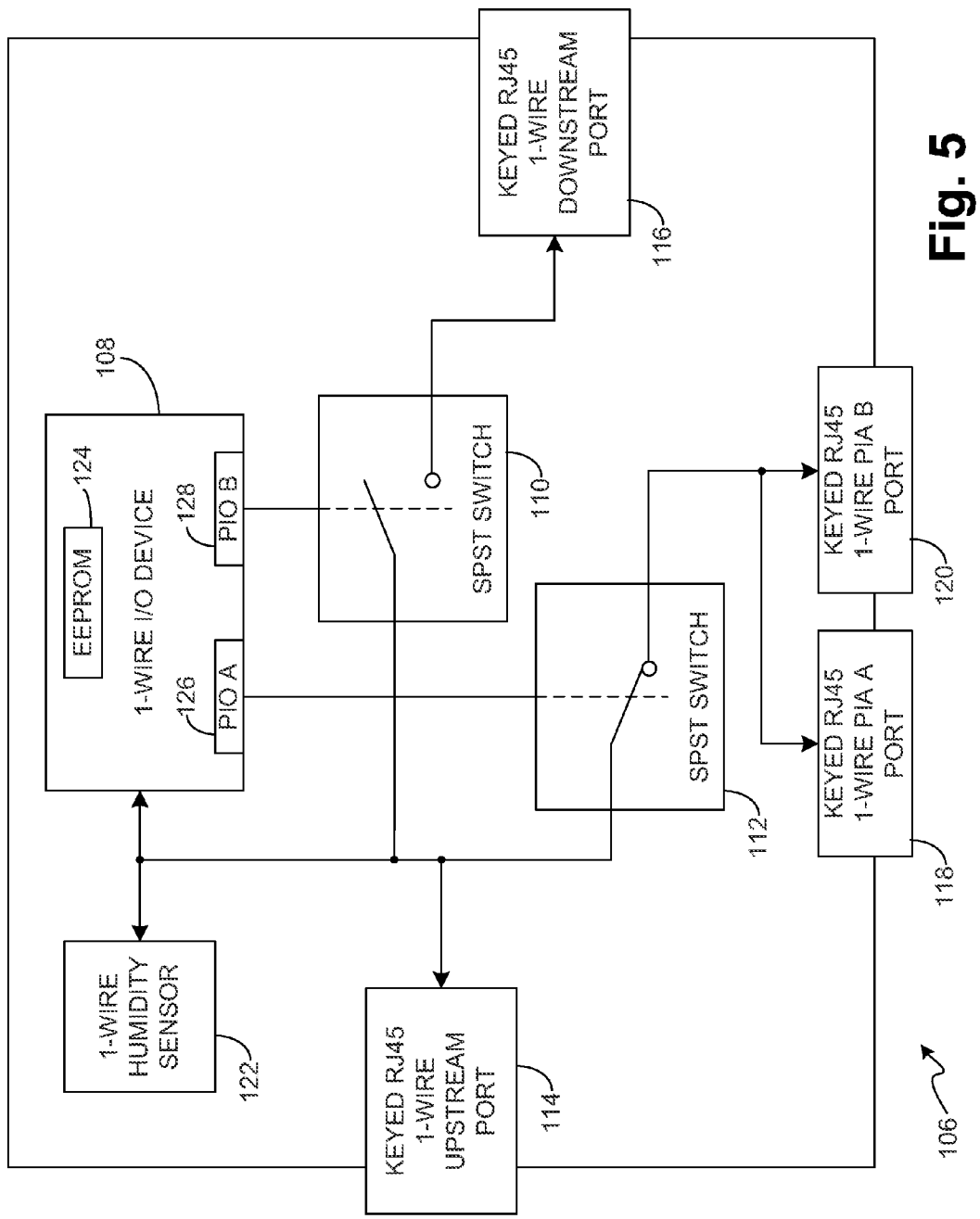
FIG. 5 shows another switching device in accordance with an embodiment of the present invention.

FIG. 5 shows another switching device in accordance with embodiments of the present invention that provides additional functionality compared to switching device 90 of FIG. 4. Switching device 106 of FIG. 5 includes 1-Wire I/O device 108 (such as the DS28E04-100 dual-channel programmable I/O chip having a 4096-bit 1-Wire EEPROM available from Maxim Integrated Products, Inc.), single pole single throw (SPST) switches 110 and 112, keyed RJ45 1-Wire upstream port 114, keyed RJ45 1-Wire downstream port 116, keyed RJ45 1-Wire PIA port A 118, keyed RJ45 1-Wire PIA port B 120, and 1-Wire humidity sensor 122.

Upstream port 114 is coupled to a switching device that is upstream in the series of network ports, or a base station if switching device 106 is the first switch in the series. The 1-Wire bus is provided from upstream port 114 to 1-Wire I/O device 108, SPST switches 110 and 112, and 1-Wire humidity sensor 122. 1-Wire I/O device 108 includes PIO A output signal 126, which is used to control SPST switch 112, PIO B output signal 128, which is used to control SPST switch 110. Switches 110 and 112 may be implemented as electro-mechanical relays, or a transistor-based switches. Under control of device 108, which acts as a switch controller, switch 110 is operable to selectively connect or disconnect the 1-Wire bus from upstream port 114 to downstream port 116. Under control of device 108, which acts as a switch controller, switch 112 is operable to selectively connect or disconnect the 1-Wire bus from upstream port 114 to keyed RJ45 1-Wire PIA port A 118 and keyed RJ45 1-Wire PIA port B 120

Compared to switching device 90 of FIG. 4, switching device 106 provides additional flexibility. As with switch 90, switching devices and associated PIAs can be discovered in sequence by sequentially coupling the PIAs of each rack to the base station, while excluding the PIAs of other racks. However, after discovery, a series of switching devices 108 can be configured to couple simultaneously all PIAs of all racks to the 1-Wire bus. In contrast, switch 90 can only couple the PIAs from one rack to the base station at any given point in time.

Switching device 106 includes an integrated 1-Wire humidity sensor 122, such as the DS1923 temperature/humidity sensor available from Maxim Integrated Products, Inc. While it is not essential to measure humidity in as many locations as temperature, it is still an important environment parameter. In general, humidity should be sufficiently high to minimize electrostatic discharge, while being sufficiently low to prevent condensation and corrosion. EEPROM 124 of device 108 stores configuration information associated with 1-Wire humidity sensor 122, along with other information characterizing the switching device, such as model number and serial number. Note that other type of sensors may be integrated into the switch device, such as a pressure sensor or a smoke sensor.

Figure 6:
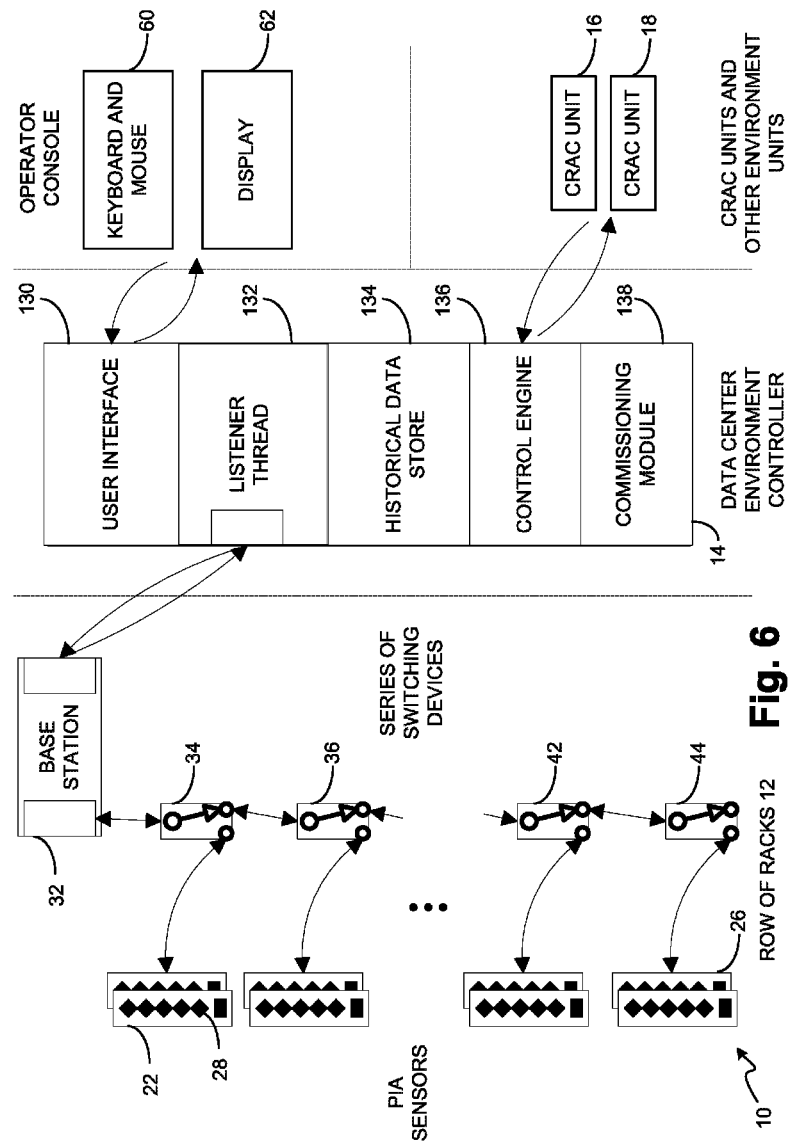
FIG. 6 is a block diagram showing data flow in the data center shown in FIG. 1, in accordance with embodiments of the present invention.

FIG. 6 is a block diagram showing data flow in data center 10 of FIG. 1. In FIG. 6, the PIAs, such as PIA 22 and 26, are coupled to corresponding switching devices 34, 36, 42, and 44 of the series of switching devices. Switching device 34 is the first switching device in the series, and is coupled to base station 32. In turn, base station 32 is coupled to DCEC 14.

FIG. 6 illustrates software modules hosted by DCEC 14. Accordingly, user interface 130 is coupled to an operator console, which includes mouse and keyboard 60 and display 62 shown in FIG. 2. Listener thread 132 communicates with base station 32 and receives switching device and PIA sequence and configuration data, along with environment measurements, such as temperature and humidity readings, from base station 32.

Commissioning module 138 communicates with control engine 136 to make incremental increases and decreases to each CRAC unit, such as CRAC units 16 and 18, to record the corresponding changes measured at each sensor of the PIAs, and records the measurements in historical data store 134. Commission module 138 then forms profiles that characterize the effect of each CRAC unit at each sensor. In turn, control engine 136 uses the profiles to control the output of each CRAC unit to ensure that each rack receives sufficient cooling, while minimizing overcooling other areas of data center 10.

Note that some customers may not deploy the commissioning module. The measurements collected have significant value even if the measurements are not used to control the CRAC units. For example, the measurements can be used to trigger alarms or identify data center locations that may have cooling duct obstructions. Commissioning module 138 is shown merely to indicate a potential use for the data collected.

Table 1 below shows an example of data stored in the EEPROM of a PIA, such as EEPROM 30 of PIA 22 shown in FIG. 1. In switching device 106 shown in FIG. 5, a similar table is stored in EEPROM 124 of 1-Wire I/O device 108, and includes information that characterizes 1-Wire humidity sensor 122.

TABLE 1

| Field Name | Contents | Comments | Length (Bytes) |
|---|---|---|---|
| Table_Version | The version of this table (possible values 00-FF) | Allow different table formats to be supported at later time. | 1 |
| PIA_PartNum | PIA manufacturer part number | This serves as a PIA family code, and implies the function performed by the PIA. Part number may also imply PIA installation location. For example, a particular part number may represent a PIA adapted to be mounted on the front of the rack, while another part number may represent a PIA adapted to be mounted on the back of the rack. | 16 |
| PIA_Serial | PIA serial number | | 16 |
| PIA_HWRev | PIA hardware revision | | 1 |
| PIA_Addr (PK) | 1-Wire 64-bit address of the EEPROM resides on this PIA | Unique PIA identifier on the 1-Wire bus - This is the primary key for a PIA's instance in the database. | 8 |
| PIA_ParmLen | Length in bytes of the following PIA-specific parameter list | A value of 0 in length indicates empty parameter list. | 1 |
| PIA_Parms | PIA specific parameter list | Optional parameters that further characterize the PIA. | N |
| SensorCount | Total number of sensor devices on this PIA | This is followed by a list of 64-bit PIA sensor addresses. | 1 |
| Sensor1_Addr | 64-bit device address of 1st sensor device | Devices in physical order on the PIA. This is the first sensor on the PIA | 8 |
| Sensor2_Addr | ... | Devices in physical order on the PIA. This is the second sensor on the PIA | 8 |
| SensorN_Addr | ... | Devices in physical order on the PIA. This is the last sensor on the PIA | 8 |
| Checksum | Table checksum. | Used by base station to verify accurate reading of table. | 1 |

Figure 7:
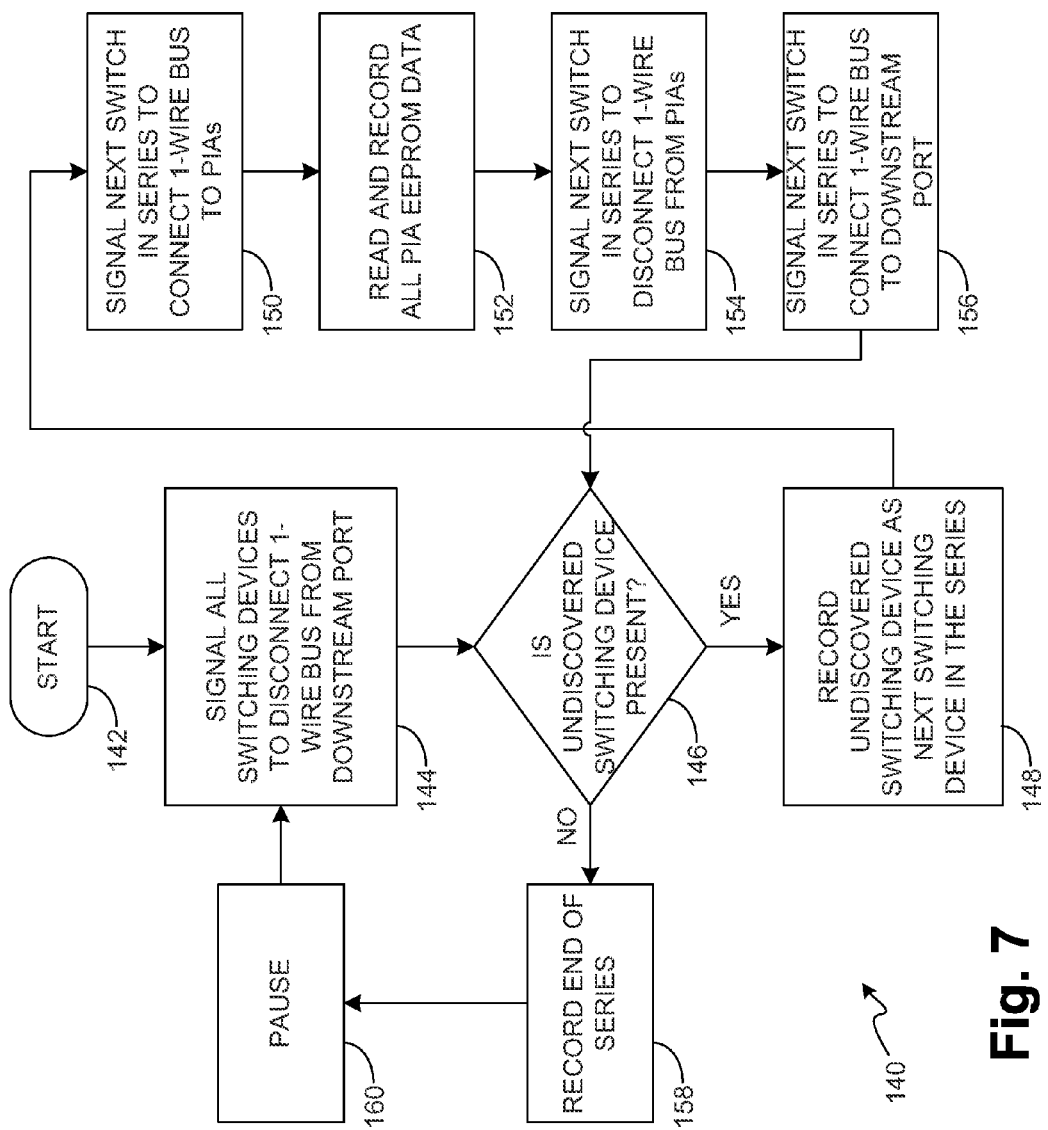
FIG. 7 shows a flowchart that describes a process that a base station uses to discover switching devices and plug-in assemblies, in accordance with embodiments of the present invention.

FIG. 7 is a flowchart 140 that describes the process that a base station uses to discover switching devices and PIAs, in accordance with an embodiment of the present invention. Before discussing FIG. 7, first consider the 1-Wire bus protocol.

A 1-Wire bus comprises a single master device, and one or more slave devices. I²C to 1-Wire bridge 76 of base station 66 shown in FIG. 3 is a 1-Wire master, and all other 1-Wire devices associated with the switching devices and PIAs are 1-Wire slaves. 1-Wire devices use two sets of commands. The first set of commands are referred to as ROM function commands, and are used for device identification and selection. The second set of commands are referred to as memory function commands, and signal 1-Wire devices to perform functions specific to the device. A ROM function command must be completed by the master to prepare a slave device to receive and execute a memory function command.

The 1-Wire protocol defines a search ROM sequence that identifies the ROM IDs of all 1-Wire slave devices. A ROM ID is a unique 64-bit number that contains a family code, serialization field, and a cyclic redundancy check (CRC). Once all slave devices have been identified, individual slave devices can be addressed using match ROM commands followed by memory function commands. Furthermore, the 1-Wire protocol defines a skip ROM command, which causes all slave devices to execute a subsequent memory function command. The skip ROM command can be used to "broadcast" a memory function command to multiple slave devices. While this simple description of the 1-Wire protocol is sufficient to facilitate an understanding of embodiments for the present invention, additional details of the 1-Wire protocol are available from Maxim Integrated Products, Inc.

Returning to flow chart 140 of FIG. 7, the process of discovering switching devices begins at start block 142. Control passes block 144, and the base station signals all switching devices to disconnect the 1-Wire bus from the downstream port.

Figure 8:
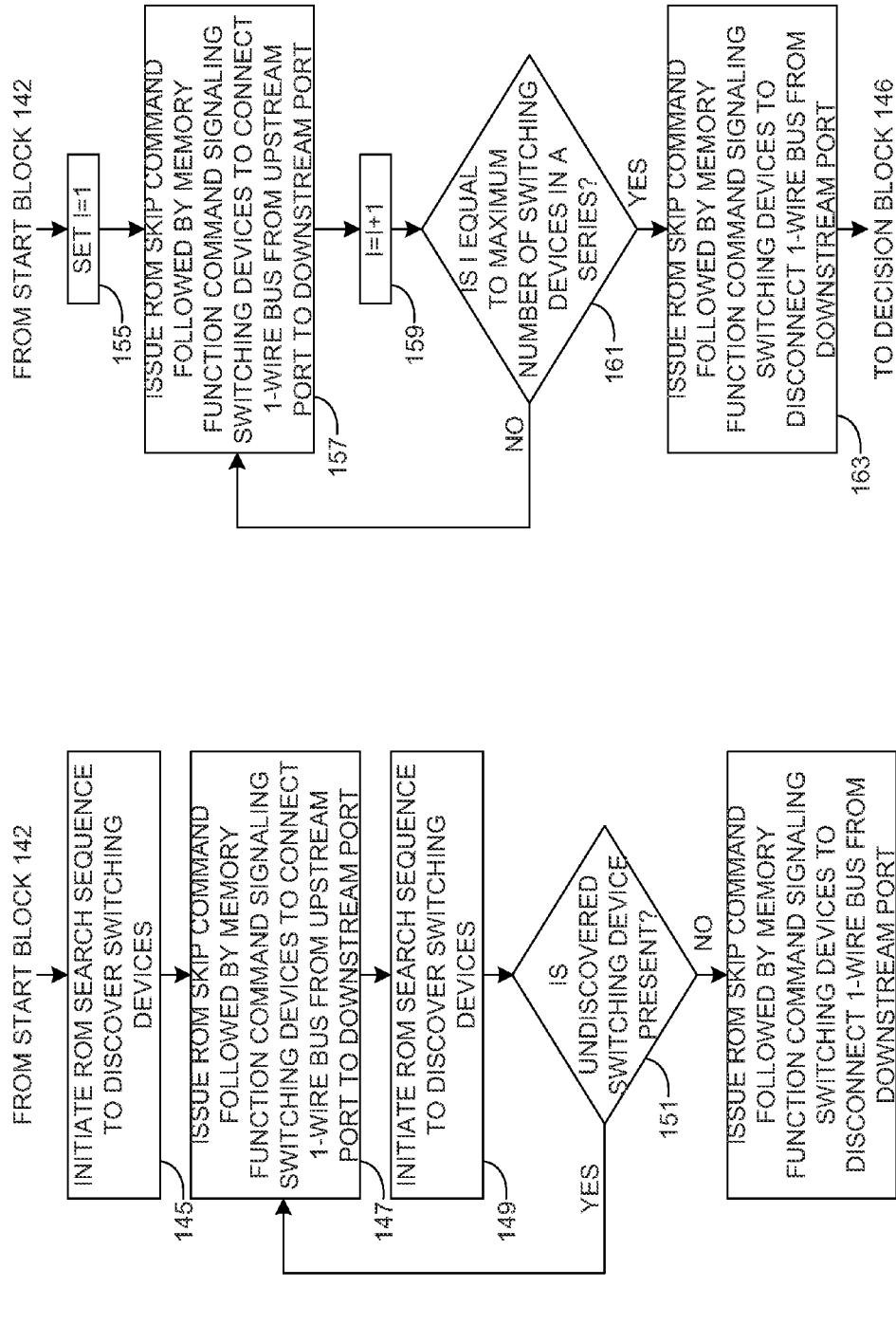
FIGS. 8A and 8B are flowcharts showing two different methods for a step shown in the flowchart of FIG. 7, in accordance with embodiments of the present invention.

FIGS. 8A and 8B show two different methods for block 144 to signal all switching devices to disconnect the 1-Wire bus from the downstream port. In FIG. 8A, control passes from block 142 to block 145, and at block 145 the base station initiates a ROM search sequence to discover all switching devices currently connected to the 1-Wire bus. Control then passes to block 147.

At block 147, the base station issues a ROM skip command followed by a memory function command signaling all switching devices to connect the 1-Wire bus from the upstream port to the downstream port. In switching device 90 of FIG. 4, device 92 signals SPDT switch 94 to couple upstream port 96 to downstream port 98. Similarly, in switching device 106 of FIG. 5, device 108 signals SPST switch 110 to coupled upstream port 114 to downstream port 116. Control then passes to block 149.

Block 149 initiates a ROM search sequence to discover all switching devices currently connected to the 1-Wire bus, and control passes to decision block 151. Decision block 151 tests whether the ROM search sequence performed at block 149 revealed an undiscovered switching device. If it did, the YES branch is taken back to block 147, and blocks 147, 149, and 151 are repeated until no additional switching devices are discovered, and then the NO branch is taken to block 153.

At block 153, the base station issues a ROM skip command followed by a memory function command signaling the switching devices to disconnect the 1-Wire bus from the downstream port. Control then passes to decision block 146 of FIG. 7.

FIG. 8B shows a different method for implementing the function represented by block 144 in FIG. 7. Control passes from start block 142 to block 155, which sets a variable I equal to one. Control then passes to block 157.

At block 157, the base station issues a ROM skip command followed by a memory function command signaling all switching devices to connect the 1-Wire bus from the upstream port to the downstream port. Control then passes to block 159, which increments the variable I by one, and then control passes to decision block 161.

Decision block 161 tests whether I is equal to a maximum number of switching devices present in a series. If the answer is no, the NO branch is taken, and blocks 157, 159, and 161 are repeated until I is equal to the maximum number of switching devices present in a series. At this point, the YES branch is taken to block 163.

At block 163, the base station issues a ROM skip command followed by a memory function command signaling the switching devices to disconnect the 1-Wire bus from the downstream port. Control then passes to decision block 146 of FIG. 7.

Returning to FIG. 7, at this point, only the first switching device in the series of switching devices is connected to the 1-Wire bus. Control then passes to decision block 146.

Decision block 146 tests whether an undiscovered switching device is present. As switching devices are discovered, the base station stores a list of switching devices along with the order in which switching devices are discovered. Decision block 146 executes a ROM search sequence to search for ROM IDs, and compares discovered ROM IDs against the list of switching devices. At this point, no switching devices have yet been discovered, and the first switching device in the series is the only switch connected to the base station. Accordingly, the YES branch is taken to block 148.

Block 148 records the undiscovered block in the list of switching devices as the next switching device in the series of switching devices. In this case, the next switching device is also the first switching device in the series. Control then passes to block 150.

At block 150, the base station has the ROM ID of the next switching device, and issues a match ROM command followed by a memory function command to cause the next switching device to couple the 1-Wire bus to the PIAs. For switching device 90 of FIG. 4, the PIAs will already be connected to the 1-wire bus since all switching devices were signaled to disconnect the 1-Wire bus from the downstream port, which also connects the 1-Wire bus to the PIAs in switch 90. For switching device 106 of FIG. 5, 1-Wire I/O device 108 signals SPST switch 112 to couple the 1-Wire bus from upstream port 114 to keyed RF45 1-Wire PIA A port 118 and keyed 1-Wire PIA B port 120. Next, control passes to block 152.

At block 152, the only PIAs attached to the 1-Wire bus are the PIAs coupled to the next switching device. Accordingly, the base station initiates a ROM search sequence to discover the PIAs, and reads and records the EEPROM data associated with each PIA. Control then passes to block 154.

At block 154, the base station issues a match ROM command followed by a memory function command to cause the next switching device to disconnect the 1-Wire bus from the PIAs. Accordingly, in switching device 90 of FIG. 4, 1-Wire I/O device 92 signals SPDT switch 94 to disconnect the 1-Wire bus from keyed RF45 1-Wire PIA A port 100 and keyed 1-Wire PIA B port 102. In switching device 106 of FIG. 5, 1-wire I/O device 108 signals SPST switch 112 to disconnect the 1-Wire bus from keyed RJ45 1-Wire PIA A port 118 and keyed 1-Wire PIA B port 120. Next, control passes to block 156.

At block 156, the base station issues a match ROM command followed by a memory function command to cause the next switching device in the series to connect the 1-Wire bus to the downstream port of the next switching device. For switch 90 of FIG. 4, this action was actually performed at block 154, since a single SPDT switch 94 is used to couple the 1-Wire bus to either the PIAs or the downstream port. For switch 106 of FIG. 2, 1-Wire device 108 signals SPST switch 110 to couple keyed RJ45 1-Wire upstream port 114 to keyed RF45 1-Wire downstream port 116.

If the next switching device in the series is also the last switching device in the series, the action performed at block 156 has not added an undiscovered switching device. However, if the there is another switching device in the series, the action performed at block 156, has added an undiscovered switching device. Control passes back to decision block 146.

If the action performed at block 156 has added an undiscovered switching device, decision block 146 will find the new switching device and the YES branch will be taken to block 148. Blocks 148, 150, 152, 154, 156, and 146 will continue to be executed until reaching the last switching device in the series of switching devices, at which point, the NO branch is taken from decision block 146 to block 158.

Block 158 records the final switching device discovered as the last switching device in the series of switching devices, and passes control to block 160.

Block 160 pauses for a period of time (e.g., one minute), and then passes control to block 144, thereby initiating the discovery process again. By periodically executing the discovery process, the present invention provides "plug and play" functionality, whereby switching devices and PIAs can be added and removed from a row of racks without the need to further configuration.

Since embodiments of the present invention discover switching devices, and thereby racks, in sequence, physical location can also be correlated to the position of the switching device in the series. Accordingly, a network technician need only associate the base station with a physical location, and the physical locations of the remaining racks in a row are inferred from the series of switching devices.

Once all switching devices, PIAs, and sensors have been discovered, base station 32 of FIG. 1 reads all sensors at a polling interval (e.g., every 10 seconds), and relays the sensor readings to DCEC 14, which in turn controls CRAC units 16 and 18. With reference to FIG. 6, each of the PIAs are accessed by progressing through the series of switching devices by alternately coupling the 1-Wire bus to the PIAs attached to the switching device, reading the PIA sensors, and then coupling the 1-Wire bus to the next switching device in the series.

In contrast, after discovery, a series of switching devices 106 (shown in FIG. 5) can be signaled to couple the 1-Wire bus to both the downstream ports and the PIAs, thereby allowing any PIA sensor in the row of rack to be read without having to send additional signals to switch SPST switches 110 and 112.

Figure 9:
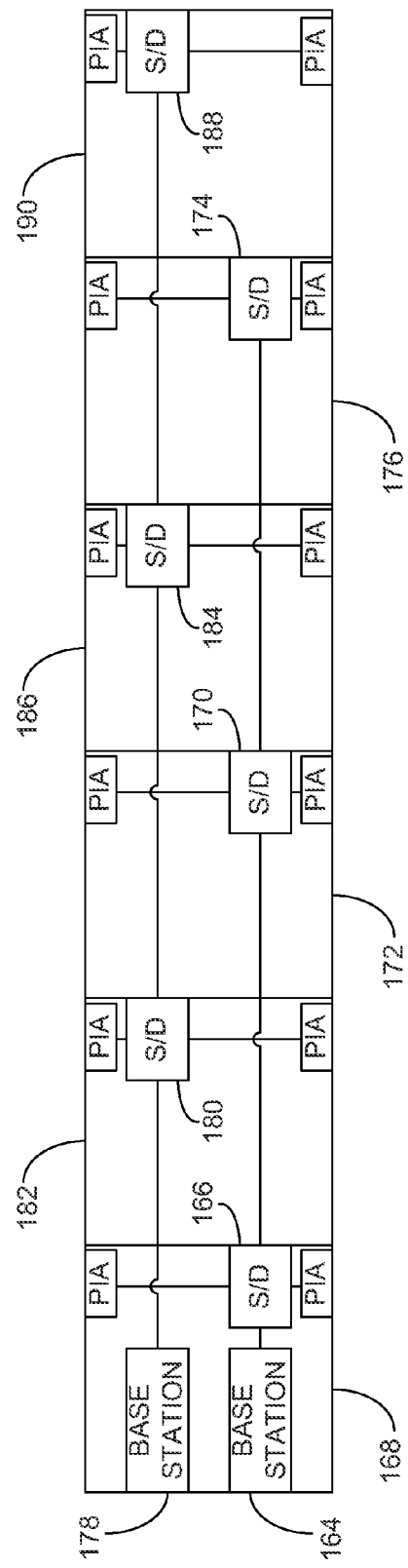
FIG. 9 shows another embodiment of the present invention in which two series of switching devices are deployed.

FIG. 9 shows another embodiment 162 of the present invention. In FIGS. 1 and 6, a single base station is shown for each row, with each rack in the row serviced by a switching device, and all the switching devices connected in a series.

In FIG. 9, two series of switching devices are deployed. Accordingly, the first series is connected to base station 164, and includes switching device 166 (which is coupled to the PIAs of rack 168), switching device 170 (which is coupled to the PIAs of rack 172), and switching device 174 (which is coupled to the PIAs of rack 176). Similarly, the second series is connected to base station 178, and includes switching device 180 (which is coupled to the PIAs of rack 182), switching device 184 (which is coupled to the PIAs of rack 186), and switching device 188 (which is coupled to the PIAs of rack 190).

By using two series of switching devices and interleaving the racks serviced by each base station, the DCEC still receives sensor readings from every other rack in the row if a base station fails, or if any of the connections in a series of switching devices are disrupted. For example, a technician may need to remove a rack for servicing. By providing sensor readings from every other rack in the event of a disruption, the DCEC still has observations, albeit with less resolution, of the environmental conditions associated with the row of racks.

As stated above, embodiments of the present invention provide considerable cost savings compared to prior DSC configurations. Switching devices in accordance with the present invention are significantly less expensive than base stations, and deploying switching devices significantly reduces Ethernet cabling.

Furthermore, embodiments of the present invention simplify the association of racks with physical locations. In prior DSC configurations, the base station of each rack had to be associated with a physical location by a manual process. Using embodiments of the present invention, only the first rack of a row need be associated with a physical location. The physical location of the remaining racks in the row can be automatically inferred from the location of the first rack and the series number of each switching device in the series of switching devices. In essence, embodiments of the present invention change the manual physical location correlation process from being rack based to being row based.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A sensor network comprising;
a first plurality of sensors;
a first base station; and
a first series of switching devices, each switching device comprising:
an upstream port;
a bus coupled to the upstream port;
a downstream port;
a sensor port connectable to the bus;
a first switch coupled to the bus and the downstream port; and
a switch controller coupled to the bus and the first switch, the switch controller responsive to signals received from the upstream port to selectively connect the bus to the downstream port and disconnect the bus from the downstream port;

wherein the first series of switching devices includes a first switching device and a last switching device, the upstream port of the first switching device is coupled to the first base station, the downstream port of each switching device, except the last switching device, is coupled to the upstream port of a next switching device in the first series of switching devices, and sensors of the first plurality of sensors are connected to sensor ports of the switching devices in the first series of switching devices.

2. The sensor network according to claim 1, wherein the first switch of at least one switching device of the series of switching devices comprises an SPDT switch, and the sensor port is coupled to the SPDT switch, wherein the SPDT switch has a first state that connects the bus to the downstream port, and a second state that connects the bus to the sensor port.

3. The sensor network according to claim 1, wherein at least one switching device of the series of switching devices further comprises:
a second switch coupled to the switch controller the bus, and the sensor port, with the switch controller responsive to signals received from the upstream port to selectively connect the bus to the sensor port and disconnect the bus from the sensor port.

4. The sensor network according to any of claim 1, 2, or 3, wherein at least one switching device of the series of switching devices further comprises:
an integrated sensor coupled to the bus; and
memory readable from the upstream port and storing data characterizing the integrated sensor.

5. The sensor network according to claim 1, and further comprising:
a second plurality of sensors;
a second base station; and
a second series of switching devices;
wherein the second series of switching devices includes a first switching device and a last switching device, the upstream port of the first switching device is coupled to the base station, the downstream port of each switching device, except the last switching device, is coupled to the upstream port of a next switching device in the series of switching devices, and sensors of the second plurality of sensors are connected to sensor ports of the switching devices in the second series of switching devices, and wherein each switching device of the first series of switching devices is associated with a rack of a first set of racks, and each switching device of the second series of switching devices is associated with a rack of a second set of racks, and racks of the first set of racks are interleaved with racks of the second set of racks.

6. A method of discovering switching devices in a series of switching devices, and sensors attached to the switching devices, wherein each switching device has an upstream port and a downstream port, the series of switching devices is formed by coupling the downstream port of each switching device, except a last switching device in the series of switching devices, to the upstream port of a next switching device in the series of switching devices, the method comprising:
signaling the switching devices to disconnect a bus from the downstream port;
determining whether a previously undiscovered switching device is present;
if a previously undiscovered switching device is present:
reading and recording data associated with sensors coupled to the previously undiscovered switching device;

signaling the previously undiscovered switching device to connect a bus to a downstream port; and
branching to determining whether a previously undiscovered switching device is present; and
if a previously undiscovered switch is not present:
recording a last undiscovered switching device as a last switching device in the series of switching devices.

7. The method according to claim 6 and further comprising;
before reading and recording data associated with sensors coupled to the previously undiscovered switching device, signaling the previously undiscovered switching device to connect the bus to sensors coupled to the previously undiscovered switching device; and
after reading and recording data associated with sensors coupled to the previously undiscovered switching device, signaling the previously undiscovered switching device to disconnect the bus from sensors coupled to the previously undiscovered switching device.

8. The method according to any of claim 6 or 7 and further comprising:
after recording a last undiscovered switching device as a last switching device in the series of switching devices:
pausing for a period of time; and
branching to signaling the switching devices to disconnect a bus from a downstream port.

9. The method according to claim 6, wherein signaling the switching devices to disconnect a bus from a downstream port comprises:
issuing first commands to the switching devices to cause each switching device that receives the first commands connect the bus to the downstream port;
determining whether a previously undiscovered switching device is present;
if a previously undiscovered switching device is present, branching to issuing first commands to the switching devices to cause each switching device that receives the first commands connect the bus to the downstream; and
if a previously undiscovered switching device is not present;
issuing second commands to the switching devices to cause each switching device to disconnect the bus from the downstream port.

10. The method according to claim 6 wherein signaling the switching devices to disconnect a bus from a downstream port comprises:
issuing N first commands to the switching devices to cause each switching device that receives the first commands connect the bus to the downstream port, wherein N is equal to or greater than a maximum number of switching devices in the series of switching devices; and
issuing second commands to the switching devices to cause each switching device to disconnect the bus from the downstream port.

11. A manufacture comprising a non-transitory computer-readable storage media encoded with a program set of computer-executable instructions, said program set for causing a base station to discover switching devices in a series of switching devices, and sensors attached to the switching devices, wherein each switching device has an upstream port and a downstream port, the series of switching devices is formed by coupling the downstream port of each switching device, except a last switching device in the series of switching devices, to the upstream port of a next switching device in the series of switching devices, the program set of the manufacture comprising:
signaling the switching devices to disconnect a bus from downstream port;
determining whether a previously undiscovered switching device present;
if a previously undiscovered switching device is present;
reading and recording at the base station data associated with sensors coupled to the previously undiscovered switching device;
signaling the previously undiscovered switching device to connect a bus to a downstream port; and
branching to determining whether a previously undiscovered switching device is present; and
if a previously undiscovered switch is not present;
recording at the base station a last undiscovered switching device as a last switching device in the series of switching devices.

12. The manufacture according to claim 11 and the program set further comprising:
before reading and recording at the base station data associated with sensors coupled to the previously undiscovered switching device, signaling the previously undiscovered switching device to connect the bus to sensors coupled to the previously undiscovered switching device; and
after reading and recording at the base station data associated with sensors coupled to the previously undiscovered switching device, signaling the previously undiscovered switching device to disconnect the bus from sensors coupled to the previously undiscovered switching device.

13. The manufacture according to any of claims 11 and the program set further comprising:
after recording at the base station a last undiscovered switching device as a last switching device in the series of switching devices:
pausing for a period of time; and
branching to signaling the switching devices to disconnect a bus from a downstream port.

14. The manufacture according to claim 11 and the program set further comprising:
transmitting from the base station to a data center environment controller data characterizing the sequence of switching devices and sensors read by the base station.

\* \* \* \* \*

UNITED STATES PATENT AND TRADEMARK OFFICE
CERTIFICATE OF CORRECTION

PATENT NO. : 8,798,078 B2
APPLICATION NO. : 13/147792
DATED : August 5, 2014
INVENTOR(S) : Moore et al.

Page 1 of 1

It is certified that error appears in the above-identified patent and that said Letters Patent is hereby corrected as shown below:

In the Claims

Column 11, line 52, Claim 1, delete "comprising;" and insert -- comprising: --, therefor.

Column 12, line 21, Claim 3, delete "controller" and insert -- controller, --, therefor.

Column 12, line 26, Claim 4, delete "claim" and insert -- claims --, therefor.

Column 13, line 20, Claim 8, delete "claim" and insert -- claims --, therefor.

Column 13, line 40, Claim 9, delete "present;" and insert -- present: --, therefor.

Column 14, line 12, Claim 11, after "from" insert -- a --.

Column 14, line 15, Claim 11, after "device" insert -- is --.

Column 14, line 16, Claim 11, delete "present;" and insert -- present: --, therefor.

Column 14, line 24, Claim 11, delete "present;" and insert -- present: --, therefor.

Column 14, line 43, Claim 13, delete "any of claims" and insert -- claim --, therefor.

Signed and Sealed this
Twenty-fifth Day of November, 2014

Michelle K. Lee
*Deputy Director of the United States Patent and Trademark Office*